(12) United States Patent
Meisenzahl

(10) Patent No.: US 7,851,822 B2
(45) Date of Patent: Dec. 14, 2010

(54) FULL FRAME ITO PIXEL WITH IMPROVED OPTICAL SYMMETRY

(75) Inventor: Eric J. Meisenzahl, Ontario, NY (US)

(73) Assignee: Eastman Kodak Company, Rochester, NY (US)

( * ) Notice: Subject to any disclaimer, the term of this patent is extended or adjusted under 35 U.S.C. 154(b) by 1205 days.

(21) Appl. No.: 11/475,463

(22) Filed: Jun. 27, 2006

(65) Prior Publication Data

US 2007/0296051 A1    Dec. 27, 2007

(51) Int. Cl.
*H01L 29/66* (2006.01)

(52) U.S. Cl. .................... 257/183.1; 257/E29.239; 257/E31.084; 250/385.1

(58) Field of Classification Search .............. 257/183.1, 257/E27.153, E29.234, E29.235, E29.239, 257/E31.075, E31.084, E31.78; 250/385.1
See application file for complete search history.

(56) References Cited

U.S. PATENT DOCUMENTS

| | | | | |
|---|---|---|---|---|
| 3,651,349 | A | * 3/1972 | Kahng et al. | 327/564 |
| 4,229,752 | A | * 10/1980 | Hynecek | 257/217 |
| 5,516,716 | A | * 5/1996 | Hawkins et al. | 438/144 |
| 6,001,668 | A | 12/1999 | Anagnostopoulos et al. | |
| 6,500,691 | B2 | 12/2002 | Kreider et al. | |

FOREIGN PATENT DOCUMENTS

EP    0 625 800 A1    11/1994

OTHER PUBLICATIONS

XP-002459704—A Large Area 1.3-Megapixel Full Frame CCD Image Sensor with a Lateral-Overflow Drain and a Transparent Gate Electrod, by S.. Kosman, E. G. Stevens, J. C. Cassidy, W.C. Chang, P. Roselle, W.A. Miller, M. Mehra, B.C. Burkey, T.H. Lee, G.A. Haawkins and R.P. Khosla, Eastman Kodak Company, Microelectronics Technoloyg Division, Rochester, NY—11.6.1-11.6.4.
XP-002459705—Two-phase full-frame CCD with double ITO gate structure for Incrased sensitivity, William Des Jardin, Steve Kosman, Neal Kurfiss, James Johnson, David Losee, Gloria Putnam, Anthony Tanbakuchi, Eastman Kodak Company, p. 59.

* cited by examiner

*Primary Examiner*—W. David Coleman
(74) *Attorney, Agent, or Firm*—Peyton C. Watkins; Nancy R. Simon

(57) ABSTRACT

A charge-coupled device includes a photosensitive region for collecting charge in response to incident light; a first and third gate electrode made of a transmissive material spanning at least a portion of the photosensitive region; and a second gate electrode made of a transmissive material that is less transmissive than the first and third gates and spans at least a portion of the photosensitive region; wherein the first, second and third gates are arranged symmetrically within an area that spans the photosensitive region.

24 Claims, 4 Drawing Sheets

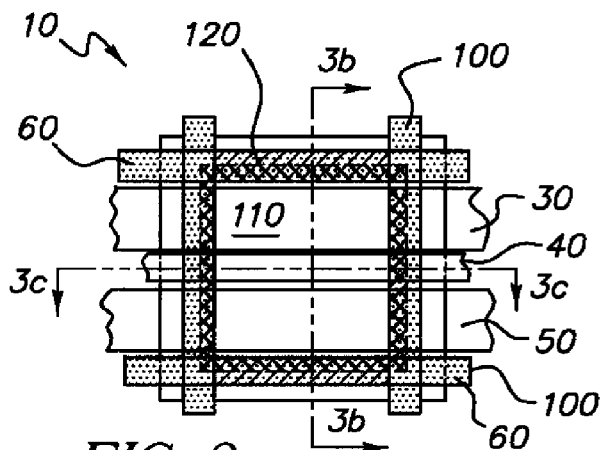
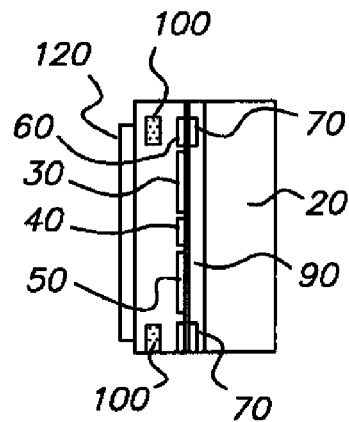
FIG. 3a
FIG. 3b
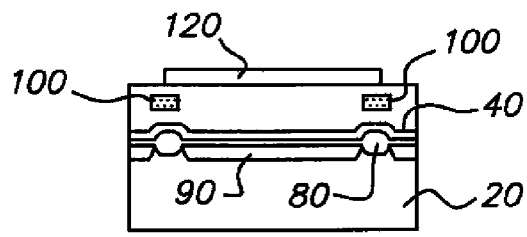
FIG. 3c
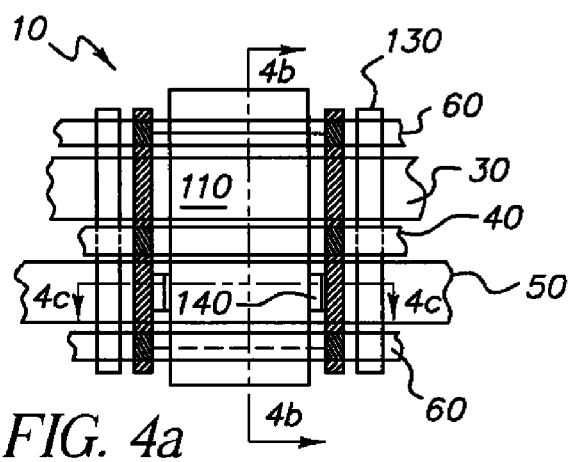
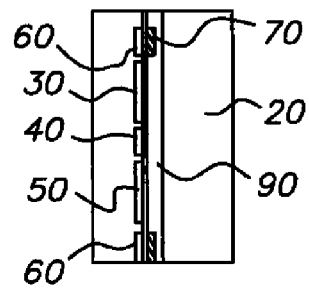
FIG. 4a
FIG. 4b
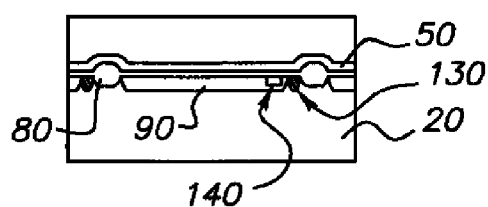
FIG. 4c

FULL FRAME ITO PIXEL WITH IMPROVED OPTICAL SYMMETRY

FIELD OF THE INVENTION

The invention relates generally to the field of charge-coupled device image sensors and, more particularly, to full-frame or frame transfer CCD type devices having improved optical symmetry.

BACKGROUND OF THE INVENTION

Full-frame or frame transfer CCD image sensors can contain electrical and optical asymmetries in the pixel depending on the wavelength and incident angle of the light. When a color version of the device is coupled to a camera lens, the asymmetries cause mismatches in the amount of cross talk between adjacent pixels, which are of a different color, and varies across the array as the camera lens will introduce a range of light ray angles depending on the pixel position in the sensor. This is referred to as a positional hue shift or 'color cast'.

Electrical asymmetries occur as a result of the electrostatic structure in the silicon that defines a pixel. Depending on the incident light angle, the position of the light shield aperture, and where signal electrons are created in the silicon, crosstalk from one pixel to another and may more easily occur in one incident light angle direction than another, creating the hue shift.

Optical asymmetries result due to a mismatch in the transmission properties of a multi-gate architecture. In particular, sensors using a combination of gate materials, such as polysilicon and indium-tin-oxide (ITO), will be more sensitive to optical asymmetries as the transmission properties of the gates become more disparate. As the incident light angles increase, the overlying light shield or other structures introduce a shadowing effect of the underlying gate materials causing preferential transmission through one type of gate material than another, creating the positional color hue shift effect. Any amount of optical asymmetry exacerbates the electrical asymmetry.

Consequently, a need exists for improving the optical symmetry of the pixel and, in particular, to improve the optical symmetry when using a combination of different gate materials. The present invention addresses this need.

SUMMARY OF THE INVENTION

The present invention is directed to overcoming one or more of the problems set forth above. Briefly summarized, according to one aspect of the present invention, the invention resides in a charge-coupled device comprising a photosensitive region for collecting charge in response to incident light; a first and third gate electrode made of a transmissive material spanning at least a portion of the photosensitive region; and a second gate electrode made of a transmissive material that is less transmissive than the first and third gates and spans at least a portion of the photosensitive region; wherein the first, second and third gates are arranged symmetrically within an area that spans the photosensitive region.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The present invention has the following advantage of improving the optical symmetry of a full-frame or frame transfer CCD sensor. More specifically, the present invention eliminates hue shift components associated with the differences in transmission of polysilicon and ITO. In practice, this would be a preferred approach for a process that uses only polysilicon gates, as the transmission properties could never be exactly matched from two different deposition steps.

BRIEF DESCRIPTION OF THE DRAWINGS

FIG. 1b illustrates a cross section along line 1b-1b of FIG. 1a;

FIG. 1c illustrates a cross section along line 1c-1c of FIG. 1a;

FIG. 2b illustrates a cross section along line 2b-2b of FIG. 2a;

FIG. 2c illustrates a cross section along line 2c-2c of FIG. 2a;

FIG. 3a illustrates a top view of the image sensor of the present invention illustrating the addition of a color filter array;

FIG. 3b illustrates a cross section along line 3b-3b of FIG. 3a;

FIG. 3c illustrates a cross section along line 3c-3c of FIG. 3a;

FIG. 4a illustrates a top view of the image sensor of the present invention illustrating the addition of an overflow channel and overflow drain;

FIG. 4b illustrates a cross section along line 4b-4b of FIG. 4a;

FIG. 4c illustrates a cross section along line 4c-4c of FIG. 4a;

FIG. 5b illustrates a cross section along line 5b-5b of FIG. 5a;

FIG. 5c illustrates a cross section along line 5c-5c of FIG. 5a;

DETAILED DESCRIPTION OF THE INVENTION

Figure 1A:
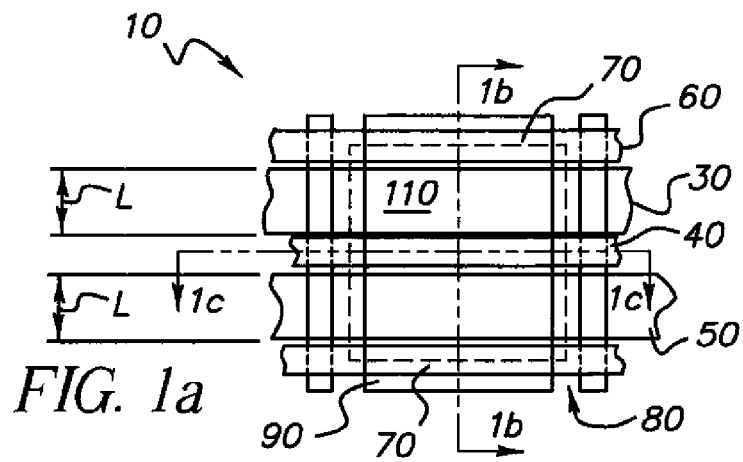
FIG. 1a illustrates a top view of the image sensor of the present invention.
Figure 1B:
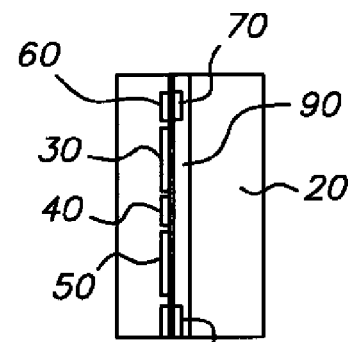
Figure 1C:
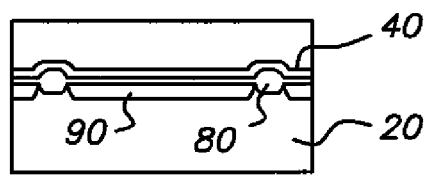

Referring to FIGS. 1a-1c, there is shown a top view of a pixel 10 of the present invention. The pixel 10 includes a substrate 20 having a plurality of transmissive gates (first gate 30, second gate 40, third gate 50 and fourth gate 60) spanning and covering the substrate 20. A barrier implant 70 is disposed in the substrate 20 and functions in cooperation with the fourth gate 60 to provide vertical pixel isolation. It is instructive to note that the first gate 30 and third gate 50, which are preferably made of indium-tin-oxide (ITO) are more transmissive relative to the second gate 40 and fourth gate 60, which are made of polysilicon. A plurality of channel stops 80 are disposed in the substrate 20 for providing horizontal isolation between pixels, one for each pixel. A buried channel 90 is disposed in the substrate 20 and functions to hold the integrated signal.

Figure 2A:
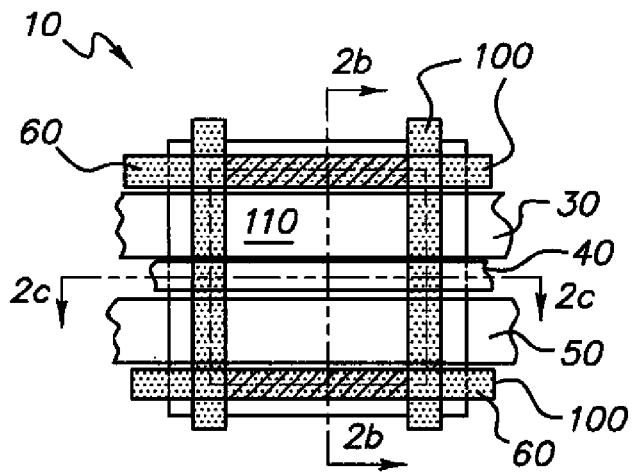
FIG. 2a illustrates a top view of the image sensor of the present invention illustrating the addition of a light shield.
Figure 2B:
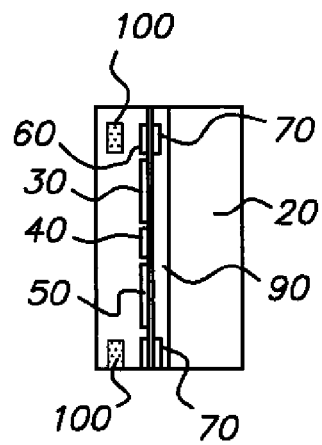
Figure 2C:
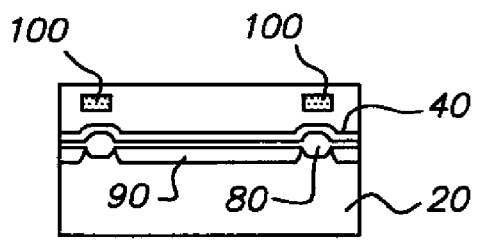

Referring to FIGS. 2a-2c, there is shown another top view of a pixel of the present invention in addition to the components described hereinabove. The pixel preferably includes a light shield 100 disposed spanning and covering predefined portions of the pixel 10. In the vertical direction, the light shield 100 is centered on the channel stop 80, and in the horizontal direction the light shield 100 is centered on the fourth gate 60. The photosensitive region 110 is defined by the area of the pixel 10 not covered with the light shield material 100. The light shield 100 also functions to provide improved pixel isolation (prevents optical cross contamination of pixels).

Referring to FIGS. 1a-1c and 2a-2c, it is instructive to note that the first gate 30, second gate 40 and third gate 50 are symmetrical or substantially symmetrical in all directions about a center point of the pixel within the area covering the photosensitive region 110. It is also to be noted that the first gate 30 and third gate 50 are preferably larger in length (illustrated by the letter L in FIG. 1a) than the second gate 40.

Referring to FIGS. 3a-3c, there is shown a top view of the pixel 10 of the present invention as described hereinabove except a color filter array 120 having a plurality of different color bandpass filters is preferably disposed covering and spanning the plurality of pixels 10. It instructive to note that each color bandpass filter is preferably centered on the center of the photosensitive region 110.

FIGS. 4a-4c illustrate the same components as FIGS. 1a-1c except that a lateral overflow drain 130 and lateral overflow channel 140 are preferably disposed in the substrate 20 and thereby controlled by either the first gate 30 or third gate 50 for providing anti-blooming control when the light exposure exceeds the signal carrying capacity of the pixel 10. It is instructive to note that symmetry or substantial symmetry of the gates as described hereinabove can be maintained in FIGS. 4a-4c by proper placement of the light shield 100 (as shown in FIGS. 3a-3c). In this case, the light shield 100 is placed covering the channel stop 80, lateral overflow drain 130 and lateral overflow channel 140.

Figure 5A:
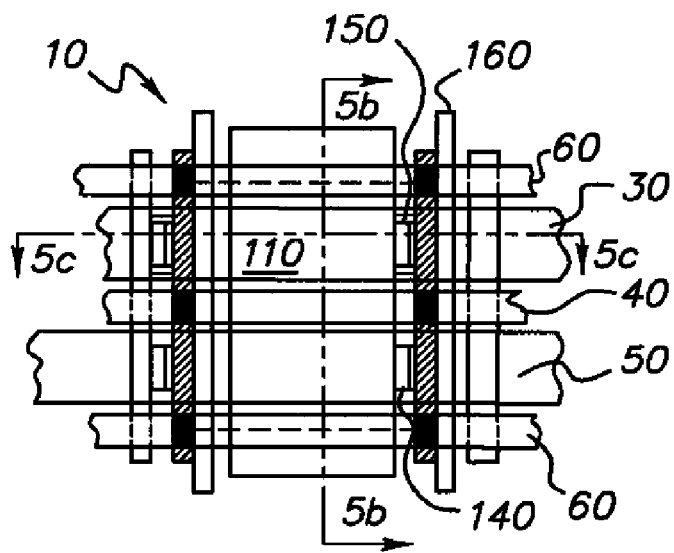
FIG. 5a illustrates a top view of the image sensor of the present invention illustrating the addition of a reset channel and reset control gate.
Figure 5B:
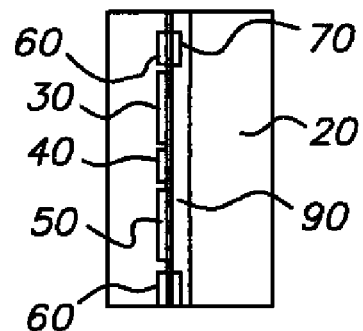
Figure 5C:
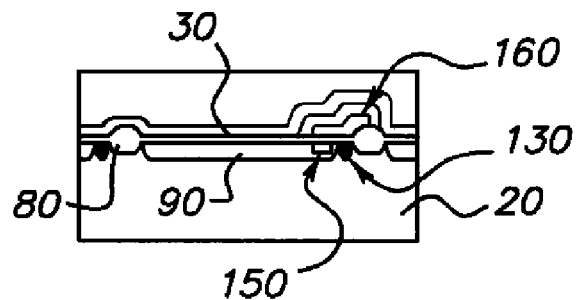

FIGS. 5a-5c illustrates the same components as FIGS. 4a-4c except that a reset channel 150 is formed in the substrate 20 for removing all charge from the photosensitive region 110 prior to integration, i.e., pixel reset. In this case, a fifth gate 160 is preferably disposed over the reset channel 150 for the purpose of initiating the pixel reset via the reset channel 150. Those skilled in the art will readily recognize the clocking operation of the gate to perform pixel reset and anti-blooming control and these will not be discussed in detail herein.

Figure 6:
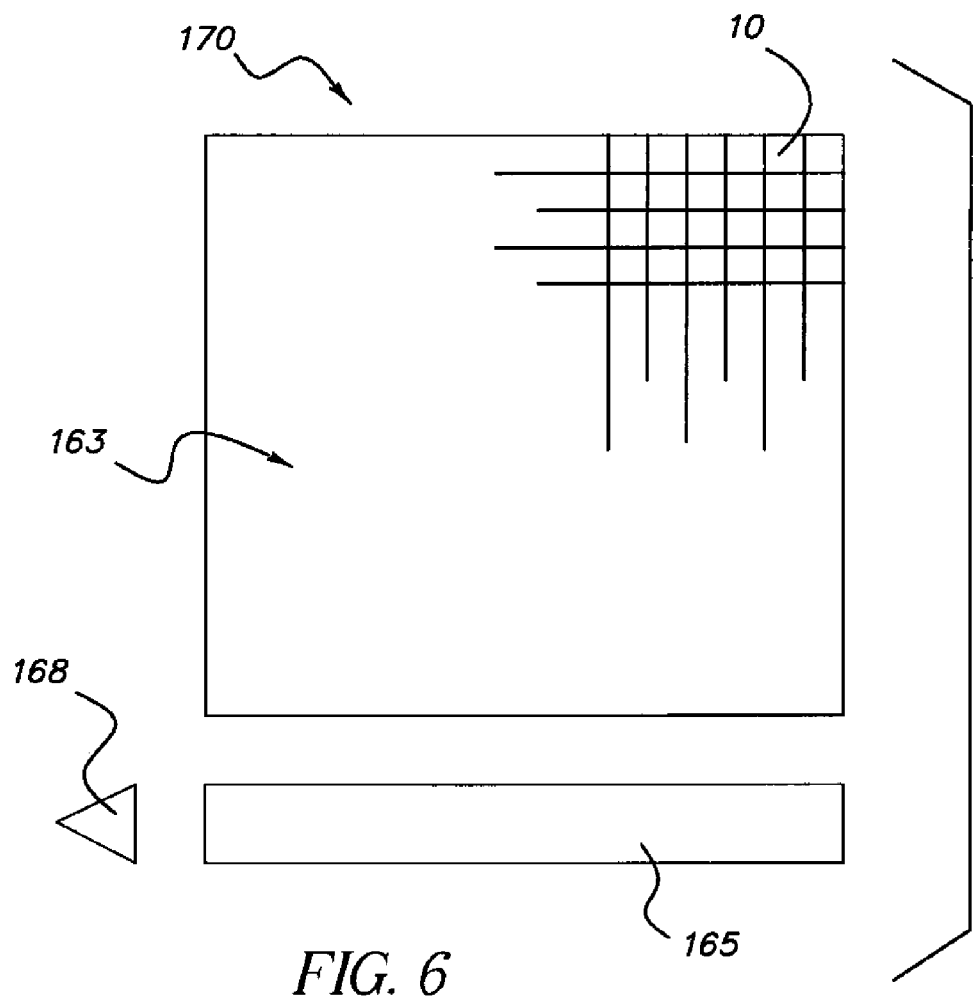
FIG. 6 is a top view illustrating the entire array of pixels for the image sensor of the present invention.

Referring to FIG. 6, there is shown a top view of the image sensor 170 of the present invention having the plurality of pixels 10 forming a pixel array 163 as described hereinabove. A horizontal shift register 165 is connected to the pixel array 163 for passing the signal from the pixels to other electronic circuitry, such as an amplifier 168, for further processing as is well known in the art.

Figure 7:
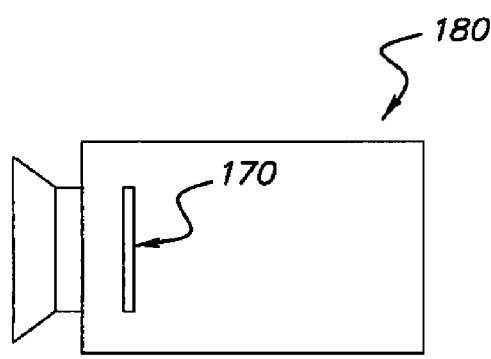
FIG. 7 is a side view of a digital camera for illustrating a typical commercial embodiment for the image sensor of the present invention.

Referring to FIG. 7, there is shown a digital camera 180 having the image sensor 170 of the present invention disposed therein for illustrating a typical commercial embodiment to which the ordinary consumer is accustomed.

The invention has been described with reference to a preferred embodiment. However, it will be appreciated that variations and modifications can be effected by a person of ordinary skill in the art without departing from the scope of the invention.

PARTS LIST 10 pixel
20 substrate
30 transmissive first gate
40 transmissive second gate
50 transmissive third gate
60 transmissive fourth gate
70 barrier implant
80 channel stop
90 buried channel
100 light shield
110 photosensitive region/area
120 color filter array
130 lateral overflow drain
140 lateral overflow channel
150 reset channel
160 fifth gate
163 pixel array
165 horizontal shift register
168 amplifier
170 image sensor
180 digital camera
L length

The invention claimed is:

1. A charge-coupled device comprising:
   (a) a photosensitive region for collecting charge in response to incident light;
   (b) a first and third gate electrode made of a transmissive material spanning at least a portion of the photosensitive region; and
   (c) a second gate electrode made of a transmissive material that is less transmissive than the first and third gates and spans at least a portion of the photosensitive region; wherein the first, second and third gates are arranged symmetrically in all directions within an area that spans the photosensitive region.

2. The charge-coupled device as in claim 1, wherein the second gate spans less area of the photosensitive region than the first and third gates.

3. The charge-coupled device as in claim 1, wherein the first and third gates are made of ITO and the second gate is made of polysilicon.

4. The charge-coupled device as in claim 1 further comprising a fourth gate that functions as a barrier between adjacent pixels.

5. The charge-coupled device as in claim 1, wherein the second gate is disposed between the first and third gates.

6. The charge-coupled device as in claim 1 further comprising a color filter array covering the photosensitive area.

7. The charge-coupled device as in claim 1 further comprising an overflow drain and associated first overflow channel adjacent to the photosensitive area for anti-blooming control.

8. The charge-coupled device as in claim 1, wherein the first, second, third gates and all or a portion of the fourth gate are arranged symmetrically within an area that spans the photosensitive region.

9. The charge-coupled device as in claim 4 further comprising a light shield covering the fourth gate.

10. The charge-coupled device as in claim 5, wherein the first and third gates are substantially the same dimension in a direction away from an edge of the second gate.

11. The charge-coupled device as in claim 10, wherein the first, second and third gates span, in the other direction, the entire photosensitive region.

12. The charge-coupled device as in claim 7 further comprising an associated second channel connected to the overflow drain and controlled by a fifth gate for global reset of all pixels.

13. A camera comprising:
a charge-coupled device comprising:
(a) a photosensitive region for collecting charge in response to incident light;
(b) a first and third gate electrode made of a transmissive material spanning at least a portion of the photosensitive region; and
(c) a second gate electrode made of a transmissive material that is less transmissive than the first and third gates and spans at least a portion of the photosensitive region; wherein the first, second and third gates are arranged symmetrically in all directions within an area that spans the photosensitive region.

14. The camera as in claim 13, wherein the second gate spans less area of the photosensitive region than the first and third gates.

15. The camera as in claim 13, wherein the first and third gates are made of ITO and the second gate is made of polysilicon.

16. The camera as in claim 13 further comprising a fourth gate that functions as a barrier between adjacent pixels.

17. The camera as in claim 13, wherein the second gate is disposed between the first and third gates.

18. The camera as in claim 13 further comprising a color filter array covering the photosensitive area.

19. The camera as in claim 13 further comprising an overflow drain and associated first overflow channel adjacent to the photosensitive area for anti-blooming control.

20. The camera as in claim 13, wherein the first, second, third gates and all or a portion of the fourth gate are arranged symmetrically within an area that spans the photosensitive region.

21. The camera as in claim 16 further comprising a light shield covering the fourth gate.

22. The camera as in claim 17, wherein the first and third gates are substantially the same dimension in a direction away from an edge of the second gate.

23. The camera as in claim 22, wherein the first, second and third gates span, in the other direction, the entire photosensitive region.

24. The camera as in claim 19 further comprising an associated second channel connected to the overflow drain and controlled by a fifth gate for global reset of all pixels.

* * * * *